(12) United States Patent
Yen et al.

(10) Patent No.: US 12,283,537 B2
(45) Date of Patent: Apr. 22, 2025

(54) ELECTRONIC PACKAGE AND METHOD OF FORMING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 483 days.

(21) Appl. No.: 17/396,604

(22) Filed: Aug. 6, 2021

(65) Prior Publication Data

US 2023/0042800 A1 Feb. 9, 2023

(51) Int. Cl.
*H01L 23/433* (2006.01)
*H01L 23/00* (2006.01)
(Continued)

(52) U.S. Cl.
CPC ...... *H01L 23/4334* (2013.01); *H01L 23/3128* (2013.01); *H01L 23/49816* (2013.01); *H01L 24/14* (2013.01); *H01L 24/16* (2013.01); *H01L 24/20* (2013.01); *H01L 24/32* (2013.01); *H01L 24/73* (2013.01); *H01L 25/0652* (2013.01); *H01L 25/0657* (2013.01); *H01L 25/50* (2013.01); *H01L 2224/14181* (2013.01); *H01L 2224/16146* (2013.01);
(Continued)

(58) Field of Classification Search
CPC . H01L 25/0657; H01L 25/0652; H01L 25/50; H01L 25/18; H01L 2225/06589; H01L 2225/06548; H01L 2224/16146; H01L 25/0655; H01L 24/14; H01L 24/73; H01L 24/20; H01L 2224/32245; H01L 2224/73253; H01L 2224/14181; H01L 2224/2101; H01L 2225/06513; H01L 2225/06541; H01L 21/568; H01L 21/6835; H01L 23/5384; H01L 23/5385; H01L 24/17; H01L 24/19; H01L 2221/68345; H01L 2221/68359; H10B 80/00; H10N 19/00
USPC .......................................... 257/777, 712, 783
See application file for complete search history.

(56) References Cited

U.S. PATENT DOCUMENTS

| 7,615,862 B2 * | 11/2009 | Huang | ................ H01L 21/4871 438/126 |
| 8,941,233 B1 * | 1/2015 | Ngai | ................ H01L 21/76898 257/706 |

(Continued)

*Primary Examiner* — Jasmine J Clark
(74) *Attorney, Agent, or Firm* — FOLEY & LARDNER LLP

(57) ABSTRACT

An electronic package is provided in the present disclosure. The electronic package comprises: a heat spreading component; a first electronic component disposed on the heat spreading component; and a second electronic component disposed on the first electronic component, wherein the second electronic component comprises an interconnection structure passing through the second electronic component and electrically connecting the first electronic component. In this way, through the use of the interconnection structure, the heat dissipation of the electronic components in the package can be improved. Also, through the use of the encapsulant, the stacked electronic components can be protected by the encapsulant so as to avoid being damaged.

16 Claims, 16 Drawing Sheets

(51) Int. Cl.
    *H01L 23/31*       (2006.01)
    *H01L 23/498*      (2006.01)
    *H01L 25/00*       (2006.01)
    *H01L 25/065*      (2023.01)

(52) U.S. Cl.
    CPC .......... *H01L 2224/2101* (2013.01); *H01L 2224/32245* (2013.01); *H01L 2224/73253* (2013.01); *H01L 2225/06513* (2013.01); *H01L 2225/06541* (2013.01); *H01L 2225/06568* (2013.01); *H01L 2225/06589* (2013.01)

(56) References Cited

U.S. PATENT DOCUMENTS

| | | | |
|---|---|---|---|
| 9,177,942 B2 * | 11/2015 | Kim | H01L 25/105 |
| 2011/0316117 A1 | 12/2011 | Kripesh et al. | |
| 2015/0303127 A1 * | 10/2015 | Michael | H01L 21/56 257/712 |

* cited by examiner

ELECTRONIC PACKAGE AND METHOD OF FORMING THE SAME

BACKGROUND

1. Technical Field

The present disclosure relates to an electronic package, and more particularly, to an electronic package including a heat spreading component and an electronic component including an interconnection structure passing therethrough.

2. Description of the Related Art

Electronic package structures for a stack of electronic components, which may be known as 2.5D or 3D IC packages, usually encounter heat dissipation issues since the stack of the electronic components makes it difficult to dissipate the heat generated by the electronic components in the stack.

As conventional 2.5D or 3D IC packages do not include a heat spreader or a heat sink, in order to avoid the breakdown of the electronic components in the stack due to poor heat dissipation, the power consumption or the working temperature of the electronic components needs to be set under a certain limit. In addition, due to the manufacturing processes of the conventional 2.5D or 3D IC packages, the conventional 2.5D or 3D IC packages cannot include a molding compound encapsulating the stacked electronic components thereof because the stacked electronic components are formed in a single unit. Thus, without the protection by the encapsulant, the structures of the conventional 2.5D or 3D IC packages for the stacked components can be easily damaged. Furthermore, due to the manufacturing processes of the conventional 2.5D or 3D IC packages, the conventional 2.5D or 3D IC packages do not include a redistribution layer, since the stacked electronic components are formed in a single unit and mounted on a package substrate such as a printed circuit board (PCB) rather than being disposed on a redistribution layer.

SUMMARY

In an aspect, an electronic package is provided. The electronic package comprises: a heat spreading component; a first electronic component disposed on the heat spreading component; and a second electronic component disposed on the first electronic component, wherein the second electronic component comprises an interconnection structure passing through the second electronic component and electrically connecting to the first electronic component.

In an aspect, an electronic package is provided. The electronic package comprises: a heat spreading component; a first electronic component disposed on the heat spreading component; a second electronic component disposed on the first electronic component, and an encapsulant disposed on the heat spreading component and encapsulating the first electronic component and the second electronic component, wherein a lateral surface of the heat spreading component is substantially aligned with a lateral surface of the encapsulant.

In an aspect, a method of forming an electronic package is provided. The method comprises: providing a heat spreading component; disposing a first electronic component on the heat spreading component through an adhesive component; disposing a second electronic component on the first electronic component, wherein the second electronic component is electrically connected to the first electronic component; and forming an encapsulant on the heat spreading component to encapsulate the adhesive component, the first electronic component and the second electronic component.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

DETAILED DESCRIPTION

Figure 1:
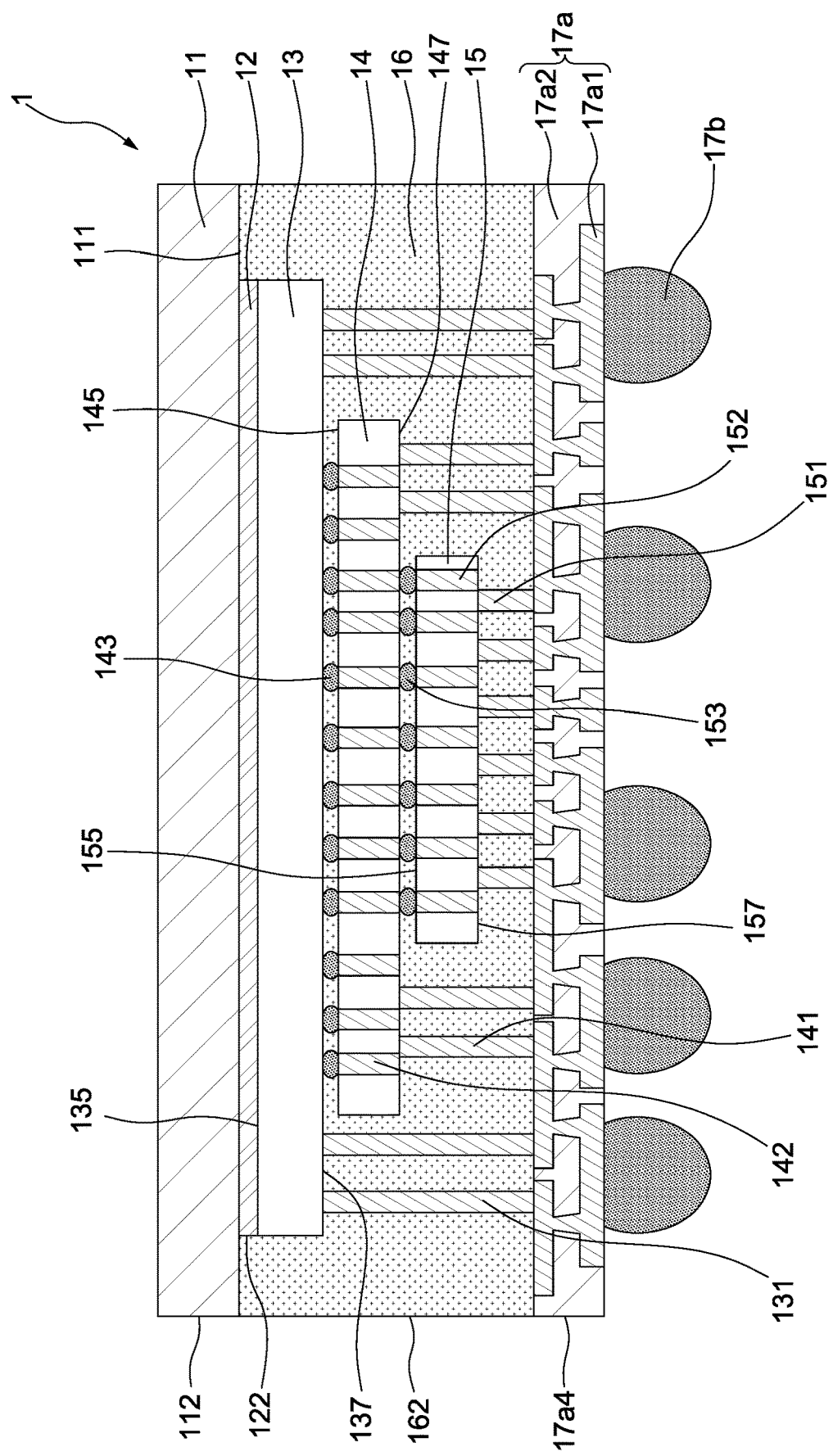
FIG. 1 illustrates a schematic cross-sectional view of an electronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "top," "bottom," "higher," "lower," "under," and so forth, are indicated with respect to the orientation shown in the figures unless otherwise specified. It should be understood that the spatial descriptions used herein are for purpose of illustration only, and that practical implementations of the structures described herein can be spatially arranged in any orientation or manner, provided that the merits of embodiments of this disclosure are not deviated by such arrangement. As used herein, the singular terms "a," "an," and "the" may include plural referents unless the context clearly dictates otherwise.

To address the issues for the traditional electronic packages for the stacked electronic components, the present disclosure provides an electronic package including a heat spreading component and at least one electronic component including an interconnection structure passing therethrough. More specifically, the heat spreading component and the interconnection structure improves the heat dissipation of the electronic package.

Referring to FIG. 1, FIG. 1 illustrates a schematic cross-sectional view of an electronic package 1 according to some embodiments of the present disclosure. The electronic package 1 includes a heat spreading component 11, an adhesive component 12, a first electronic component 13, a second electronic component 14, a third electronic component 15, an encapsulant 16, a redistribution structure 17a, and an electrical connection 17b. The electronic package 1 further includes a plurality of conductive pillars 131, 141, and 151, interconnections 142 and 152, and a plurality of bumps 143 and 153.

As shown in FIG. 1, the adhesive component 12 is disposed on the heat spreading component 11, and the first electronic component 13 is disposed on the adhesive component 12 with its surface 135 attached to the adhesive component 12. That is, the first electronic component 13 is disposed on the heat spreading component 11 through the adhesive component 12. In some embodiments of the present disclosure, the surface 135 of the first electronic component 13 is the non-active side of the first electronic component 13. Thus, the non-active side of the first electronic component 13 is arranged to face the heat spreading component 11. The second electronic component 14 is disposed on the first electronic component 13 through the plurality of bumps 143. That is, the bumps 143 are arranged between the surface 137 of the first electronic component 13 and a surface 145 of the second electronic component 14. In some embodiments of the present disclosure, the surface 145 of the second electronic component 14 is the non-active side of the second electronic component 14. The third electronic component 15 is disposed on the second electronic component 14 through the plurality of bumps 153. That is, the bumps 153 are arranged between the surface 147 of the second electronic component 14 and a surface 155 of the third electronic component 15. In some embodiments of the present disclosure, the surface 155 of the third electronic component 15 is the non-active side of the third electronic component 15.

As shown in FIG. 1, a cross-sectional width of the first electronic component 13 may be greater than a cross-sectional width of the second electronic component 14, and a cross-sectional width of the second electronic component 14 may be greater than a cross-sectional width of the third electronic component 15. That is, a size of the first electronic component 13 may be greater than a size of the second electronic component 14, and a size of the second electronic component 14 may be greater than a size of the third electronic component 15. The conductive pillars 131 are disposed on the surface 137 of the first electronic component 13 and are electrically connected between the first electronic component 13 and the redistribution structure 17a. In some embodiments of the present disclosure, the surface 137 of the first electronic component 13 is an active side of the first electronic component 13. In some embodiments of the present disclosure, the conductive pillars 131 include tall conductive pillars (e.g., having a height greater than 200 micrometer). The conductive pillars 141 are disposed on the surface 147 of the second electronic component 14 and are electrically connected between the second electronic component 14 and the redistribution structure 17a. In some embodiments of the present disclosure, the conductive pillars 141 include tall conductive pillars (e.g., having a height greater than 200 micrometer). The conductive pillars 151 are disposed on the surface 157 of the third electronic component 15 and are electrically connected between the third electronic component 15 and the redistribution structure 17a. In some embodiments of the present disclosure, the conductive pillars 151 include tall conductive pillars (e.g., having a height greater than 200 micrometer). In some embodiments of the present disclosure, the conductive pillars 131 may be disposed on the peripheral portion of the first electronic component 13. In some embodiments of the present disclosure, the conductive pillars 141 may be disposed on the peripheral portion of the first electronic component 14.

The second electronic component 14 may include an interconnection structure 142, and the third electronic component 15 may include an interconnection structure 152. The interconnection structure 142 may pass through the second electronic component 14 and contact the bumps 143 between the first electronic component 13 and the second electronic component 14. The interconnection structure 152 may pass through the second electronic component 15 and contact the bumps 153 between the third electronic component 15 and the second electronic component 14. The interconnection structure 152 is electrically connected to at least a portion of the interconnection structure 142 through the bumps 153 between the second electronic component 14 and the third electronic component 15.

The encapsulant 16 may be arranged between the heat spreading component 11 and the redistribution structure 17a, and is configured to encapsulate the adhesive component 12, the first electronic component 13, the second electronic component 14, the third electronic component 15, and the conductive pillars 131, 141, and 151. In some embodiments of the present disclosure, the encapsulant 16 contacts a side surface 122 of the adhesive component 12. In some embodiments of the present disclosure, the encapsulant 16 contacts a surface 111 of the heating spreading component 11, which faces the redistribution structure 17a. In some embodiments of the present disclosure, a lateral surface 112 of the heating spreading component 11 is substantially coplanar with a lateral surface 162 of the encapsulant 16. In some embodiments of the present disclosure, the lateral surface 112 of the heating spreading component 11 is substantially aligned with a lateral surface 162 of the encapsulant 16. In some embodiments of the present disclosure, the lateral surface 162 of the encapsulant 16 is substantially coplanar with a lateral surface 17a4 of the redistribution structure 17a. In some embodiments of the present disclosure, the lateral surface 162 of the encapsulant 16 is substantially aligned with the lateral surface 17a4 of the redistribution structure 17a. The electrical connection 17b is disposed at a side of the redistribution structure 17a (e.g., on a surface of the redistribution structure 17a), which faces away from first electronic component 13.

In some embodiments, the heat spreading component 11 includes a heat sink. In some embodiments, the heat spreading component 11 includes a high thermal conductive film. In some embodiments, the heat spreading component 11 may be a metal heat sink. In some embodiments, the adhesive component 12 may be a thermal conductive layer such as a thermal tape or a thermal conductive adhesive in a tape form with a substantive uniform thickness. In some embodiments, the electronic package 1 includes two stacked electronic components. In some embodiments, the electronic package 1 includes three or more stacked electronic components. In some embodiments, the first electronic component 13, the second electronic component 14, and the third electronic component may be a die, a logic device, a memory device, a radio-frequency (RF) component 15, a microelectromechanical system (MEMS) device, or any other active device. In some embodiments, the conductive pillars 131, 141, and 151 may be copper pillars or conductive metal pillars. In some embodiments, the interconnection structures 142 and 152 comprises vias such as through semiconductor vias or through-silicon vias (TSVs) formed by copper or conductive metal. In some embodiments, the micro bumps 143 and 153 may be solders formed by suitable metal materials. In some embodiments, the encapsulant 16 may be epoxy molding compound (EMC) or any other suitable molding compound. In some embodiments, the redistribution structure 17a may be a redistribution layer (RDL) including metal traces 17a1 and a dielectric material 17a2. In some embodiments, the electrical connection 17b may be bumps or solder balls formed by suitable metal materials.

As described above, the second electronic component 14 includes an interconnection structure 142, and the third electronic component 15 includes an interconnection structure 152. The third electronic component 15 is electrically connected to the second electronic component 14 by electrically connecting the interconnection structure 152 to the interconnection structure 142 through the bumps 153. The second electronic component 14 is electrically connected to the first electronic component 13 by connecting the interconnection structure 142 to the active surface of the first electronic component 13 through the bumps 143. Therefore, the third electronic component 15 and the second electronic component 14 are electrically connected to the first electronic component 13 through the interconnection structure 152 and the interconnection structure 142.

As the electrical connections mentioned above also provides for heat conductivity, the interconnection structure 142 and the interconnection structure 152 also provide heat transmission paths among the first electronic component 13, the second electronic component 14, and the third electronic component 15. With the interconnection structure 142 and the interconnection structure 152, the heat generated by the second electronic component 14 and the third electronic component 15 can be transmitted to the first electronic component 13 and then be dissipated through the heat spreading component 11 attached to the first electronic component 13. The conductive pillars 131, 141, and 151 provide heat transmission paths among the first electronic component 13, the second electronic component 14, the third electronic component 15, and the redistribution structure 17a. With the conductive pillars 131, 141, and 151, the heat generated by the first electronic component 13, the second electronic component 14, and the third electronic component 15 can be transmitted to the redistribution structure 17a and then be dissipated through the electrical connection 17b. Thus, the interconnection structures 142 and 152 and the conductive pillars 131, 141, and 151 together with the redistribution structure 17a and the electrical connection 17b provide additional heat dissipation capability for the electronic package 1.

Figure 2:
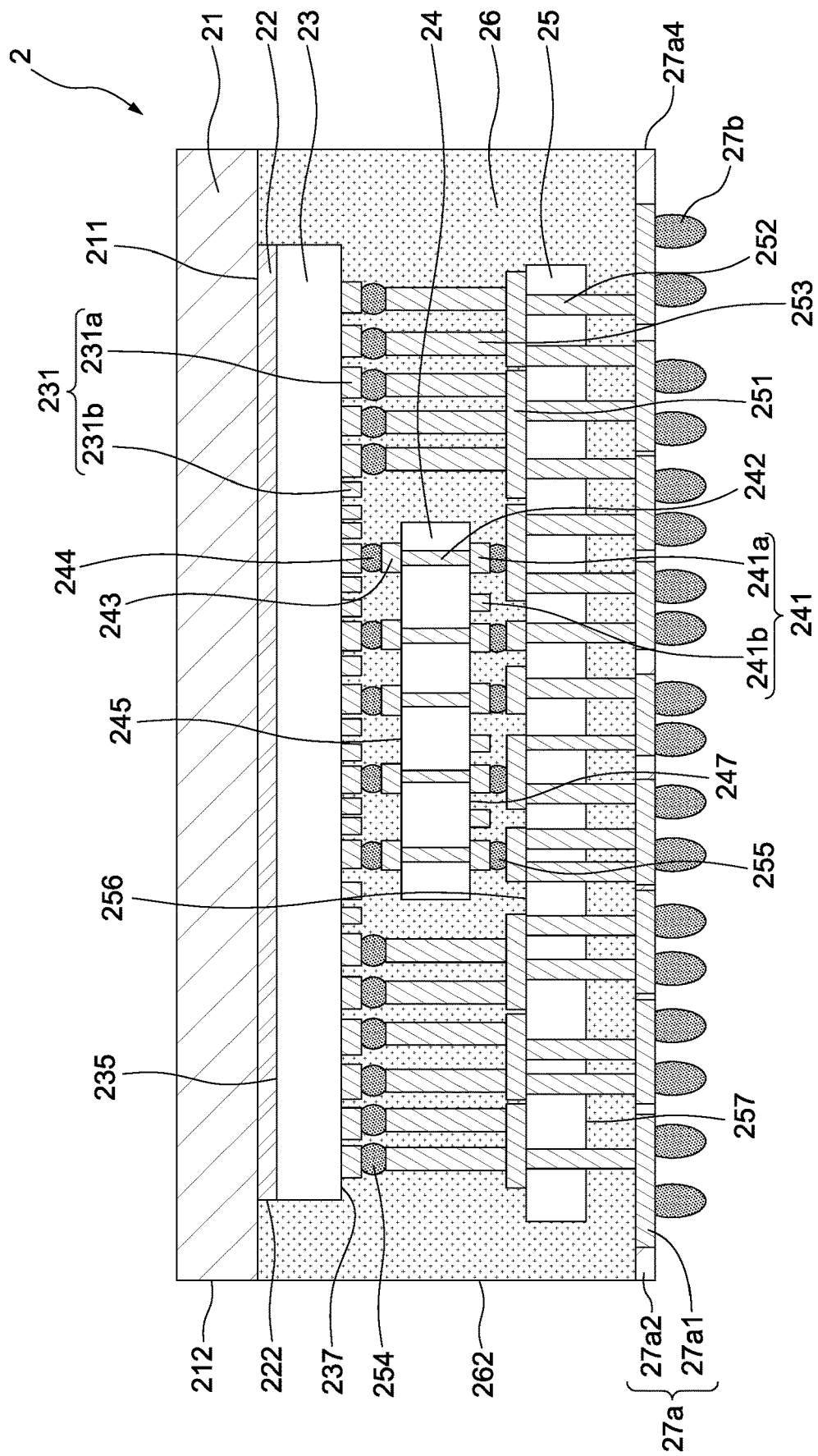
FIG. 2 illustrates a schematic cross-sectional view of an electronic package according to some embodiments of the present disclosure.

Referring to FIG. 2, FIG. 2 illustrates a schematic cross-sectional view of a electronic package 2 according to some embodiments of the present disclosure. The electronic package 2 includes a heat spreading component 21, an adhesive component 22, a first electronic component 23, a second electronic component 24, an interposer 25, an encapsulant 26, and a redistribution structure 27a, and an electrical connection 27b. The electronic package 2 further includes a plurality of electric connections 231, 241, and 243, micro bumps 244, 254, and 255, interconnections 242 and 252, wiring 251, and conductive pillars 253.

As shown in FIG. 2, the adhesive component 22 is disposed on the heat spreading component 21, and the first electronic component 23 is disposed on the adhesive component 22 with its surface 235 attached to the adhesive component 22. That is, the first electronic component 23 is disposed on the heat spreading component 21 through the adhesive component 22. In some embodiments of the present disclosure, the surface 235 of the first electronic component 23 is the non-active side of the first electronic component 23. Thus, the non-active side of the first electronic component 23 is arranged to face the heat spreading component 21. The second electronic component 24 is disposed on the first electronic component 23.

The first electronic component 23 includes a plurality of electric connections 231 formed on a surface 237 of the first electronic component 23. In some embodiments of the present disclosure, the surface 237 of the first electronic component 23 is the active side of the first electronic component 23. In some embodiments of the present disclosure, the electric connections 231 may be bumps, pads or any other suitable electrically connecting elements. In some embodiments of the present disclosure, the electric connections 231 include bumps 231a and dummy bumps 231b, and the dummy bumps 231b are not electrically connected to any other elements other than the first electronic component 23. The second electronic component 24 includes a plurality of electric connections 241 on the surface 247 of the second electronic component 24 and includes a plurality of electric connections 243 on the surface 245 of the second electronic component 24. In some embodiments of the present disclosure, the electric connections 241 and 243 may be bumps, pads, or any other suitable electrically connecting elements. In some embodiments of the present disclosure, the electric connections 241 include bumps 241a and dummy bumps 241b, and the dummy bumps 241b are not electrically connected to any other elements other than the second electronic component 24. The second electronic component 24 also includes the interconnection structure 242 passing through the second electronic component 24. The second electronic component 24 is disposed on the first electronic component 23 through the micro bumps 244 between the surface 237 of the first electronic component 23 and the surface 245 of the second electronic component 24. In some embodiments of the present disclosure, the micro bumps 244 connect the electric connections 243 and the bumps 231a of the electric connections 231.

The interposer 25 includes a wiring 251 on a surface 256 of the interposer 25 facing the first electronic component 23 and the second electronic component 24, and includes an interconnection structure 252 passing through the interposer 25. The interconnection structure 252 is electrically connected between the wiring 251 and the redistribution structure 27a. The conductive pillars 253 are connected between the first electronic component 23 and the interposer 25. In some embodiments of the present disclosure, the conductive pillars 253 are electrically connected to the bumps 231a of the electric connections 231 on the surface 237 of the first electronic component 23 through the micro bumps 254. The conductive pillars 253 are also electrically connected to the wiring 251. In some embodiments of the present disclosure, the conductive pillars 253 include tall conductive pillars (e.g., having a height greater than 200 micrometer). The second electronic component 24 is electrically connected to the wiring 251 through the micro bumps 255 between the surface 247 of the second electronic component 24 and the surface 256 of the interposer 25. In some embodiments of the present disclosure, the micro bumps 255 electrically connects the bumps 241a of the electric connections 241 on the surface 247 of the second electronic component 24.

As shown in FIG. 2, a cross-sectional width of the first electronic component 23 may be greater than a cross-sectional width of the second electronic component 24, and a cross-sectional width of the interposer 25 may be greater than the cross-sectional width of the second electronic component 24. That is, a size of the first electronic component 23 may be greater than a size of the second electronic component 24, and a size of the interposer 25 may be greater than a size of the second electronic component 24.

The encapsulant 26 is arranged between the heat spreading component 21 and the redistribution structure 27a, and configured to encapsulate the adhesive component 22, the first electronic component 23, the second electronic component 24, the interposer 25, and the conductive pillars 253. According to some embodiments of the present disclosure, the encapsulant 26 contacts a side surface 222 of the adhesive component 22. In some embodiments of the present disclosure, the encapsulant 26 contacts the surface 211 of the heating spreading component 21, which faces the redistribution structure 27a. In some embodiments of the present disclosure, a lateral surface 212 of the heating spreading component 21 is substantially coplanar with a lateral surface 262 of the encapsulant 26. In some embodiments of the present disclosure, the lateral surface 212 of the heating spreading component 21 is substantially aligned with the lateral surface 262 of the encapsulant 26. In some embodiments of the present disclosure, the lateral surface 262 of the encapsulant 26 is substantially coplanar with a lateral surface 27a4 of the redistribution structure 27a. In some embodiments of the present disclosure, the lateral surface 262 of the encapsulant 26 is substantially aligned with the lateral surface 27a4 of the redistribution structure 27a. The electrical connection 27b is disposed at a side of the redistribution structure 27a (e.g., on a surface of the redistribution structure 27a), which faces away from the first electronic component 23.

In some embodiments, the heat spreading component 21 includes a heat sink. In some embodiments, the heat spreading component 21 includes a high thermal conductive film. In some embodiments, the heat spreading component 11 may be a metal heat sink. In some embodiments, the adhesive component 22 may be a thermal conductive layer such as a thermal tape or a thermal conductive adhesive in a tape form with a substantive uniform thickness. In some embodiments, the electronic package 2 includes two stacked electronic components. In some embodiments, the electronic package 2 includes three or more stacked electronic components. In some embodiments, the first electronic component 23 and the second electronic component 24 may be a die, a logic device, a memory device, a radio-frequency (RF) device, a microelectromechanical system (MEMS) device, or any other active device. In some embodiments, the interpose 25 may be a silicon interposer. In some embodiments, the conductive pillars 253 may be copper pillars or conductive metal pillars. In some embodiments, the interconnection structures 242 and 252 comprises vias such as through semiconductor vias or through-silicon vias (TSVs) formed by copper or conductive metal. In some embodiments, the micro bumps 244, 254, and 255 may be solders formed by suitable metal materials. In some embodiments, the encapsulant 26 may be epoxy molding compound (EMC) or any other suitable molding compound. In some embodiments, the redistribution structure 27a may be a redistribution layer (RDL) or a wiring board including metal traces 27a1 and a dielectric material 27a2. In some embodiments, the electrical connection 27b includes bumps or solder balls formed by suitable metal materials.

As described above, the second electronic component 24 includes the interconnection structure 242, and the interposer 25 includes the interconnection structure 252. The second electronic component 24 is electrically connected to the first electronic component 23 and to the redistribution structure 27a through the interconnection structure 242. As the electrical connections mentioned above also provides for heat conductivity, the interconnection structure 242 and 252 provide heat transmission paths among the first electronic component 23, the second electronic component 24, and the redistribution structure 27a. With the interconnection structure 242 and 252, the heat generated by the second electronic component 14 can be transmitted to the first electronic component 23 and then be dissipated through the heat spreading component 21 attached to the first electronic component 23, can be transmitted to the redistribution structure 27a and then be dissipated through the electrical connections 27b. With the interconnection structure 242 and 252 or with the interconnection structure 252 and the conductive pillars, the heat generated by the first electronic component 23 can be transmitted to the redistribution structure 27a and then be dissipated through the electrical connections 27b. Thus, the interconnection structures 242 and 252 and the conductive pillars 253 together with the redistribution structure 27a and the electrical connection 27b provide additional heat dissipation capability for the electronic package 2.

FIGS. 3A-3D each illustrates a schematic cross-sectional view of a structure at various fabrication stages using a method for manufacturing an electronic package 1 according to some embodiments of the present disclosure.

Figure 3A:
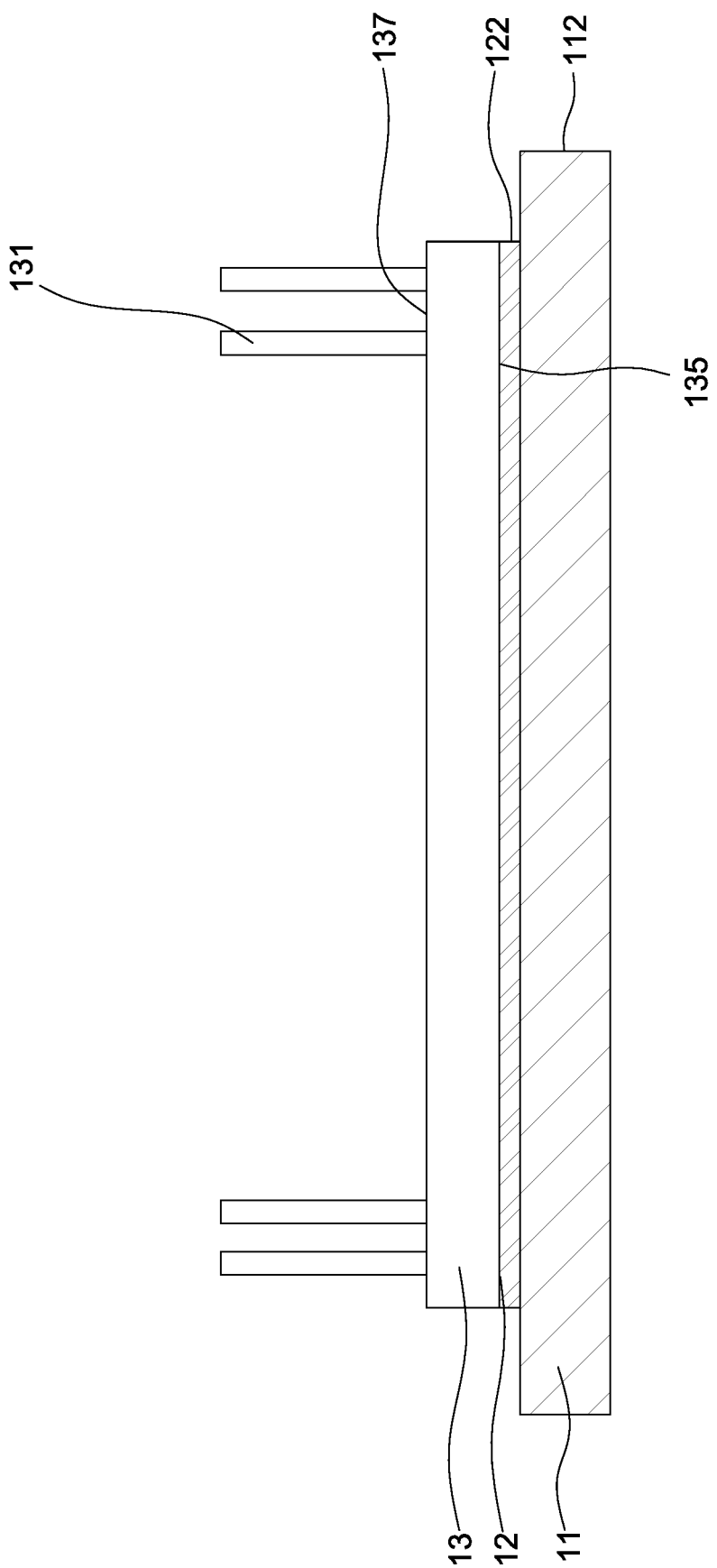
FIG. 3A.

Referring to FIG. 3A, a heat spreading component 11 is provided, an adhesive component 12 is applied on the heat spreading component 11, and the first electronic component 13 is attached to the heat spreading component 11 through the adhesive component 12 with the surface 135 facing the heat spreading component 11. In some embodiments, the surface 135 is the non-active surface of the first electronic component 13. The conductive pillars 131 are formed on the peripheral portion of the first electronic component 13. According to some embodiments of the disclosure, the adhesive component 12 may be a thermal conductive adhesive in a tape form, which has a substantive uniform thickness so that it can seamlessly connects the heat spreading component 11 and the first electronic component 13 together. Furthermore, using the thermal conductive adhesive in a tape form to attach the electronic component to the heat spreading component simplifies the manufacturing process and thus increases the production rate (or units per hour, UPH) of the electronic package.

Figure 3B:
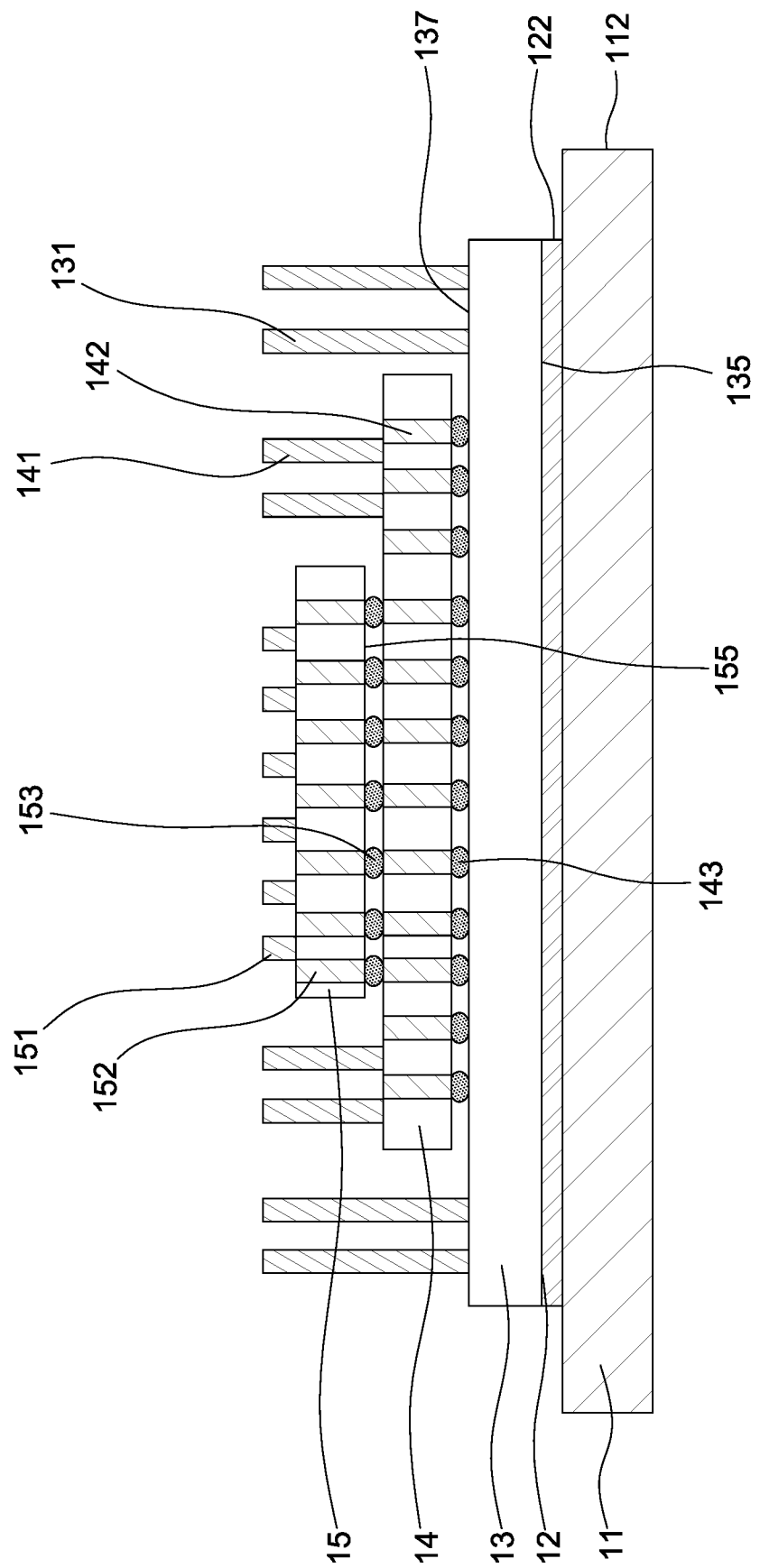
FIG. 3B, FIG. 3C and FIG. 3D each illustrates a schematic cross-sectional view of a structure at various fabrication stages using a method for manufacturing an electronic package according to some embodiments of the present disclosure.

Referring to FIG. 3B, the second electronic component 14 and the third electronic component 15 is disposed on the first electronic component 13 through the micro bumps 143. According to some embodiments of the present disclosure, the second electronic component 14 and the third electronic component 15 are formed as a stack and are disposed on the first electronic component 13 at the same time. According to some embodiments of the present disclosure, the second electronic component 14 is first disposed on the first electronic component 13, and then the third electronic component 15 is disposed on the second electronic component 14. The second electronic component 14 includes the interconnection structure 142 passing therethrough, and the third electronic component 15 includes the interconnection structure 152 passing therethrough. As shown in FIG. 3B, the stack of the second electronic component 14 and the third electronic component 15 is electrically connected to the first electronic component 13 through the micro bumps 153, and the second electronic component 14 and the third electronic component 15 are electrically connected to each other, with the interconnection structure 152 electrically connected to a portion of the interconnection structure 142. The conductive pillars 131, 141 and 151 are respectively formed on the active sides of the first electronic component 13, the second electronic component 14, and second electronic component 15.

Figure 3C:
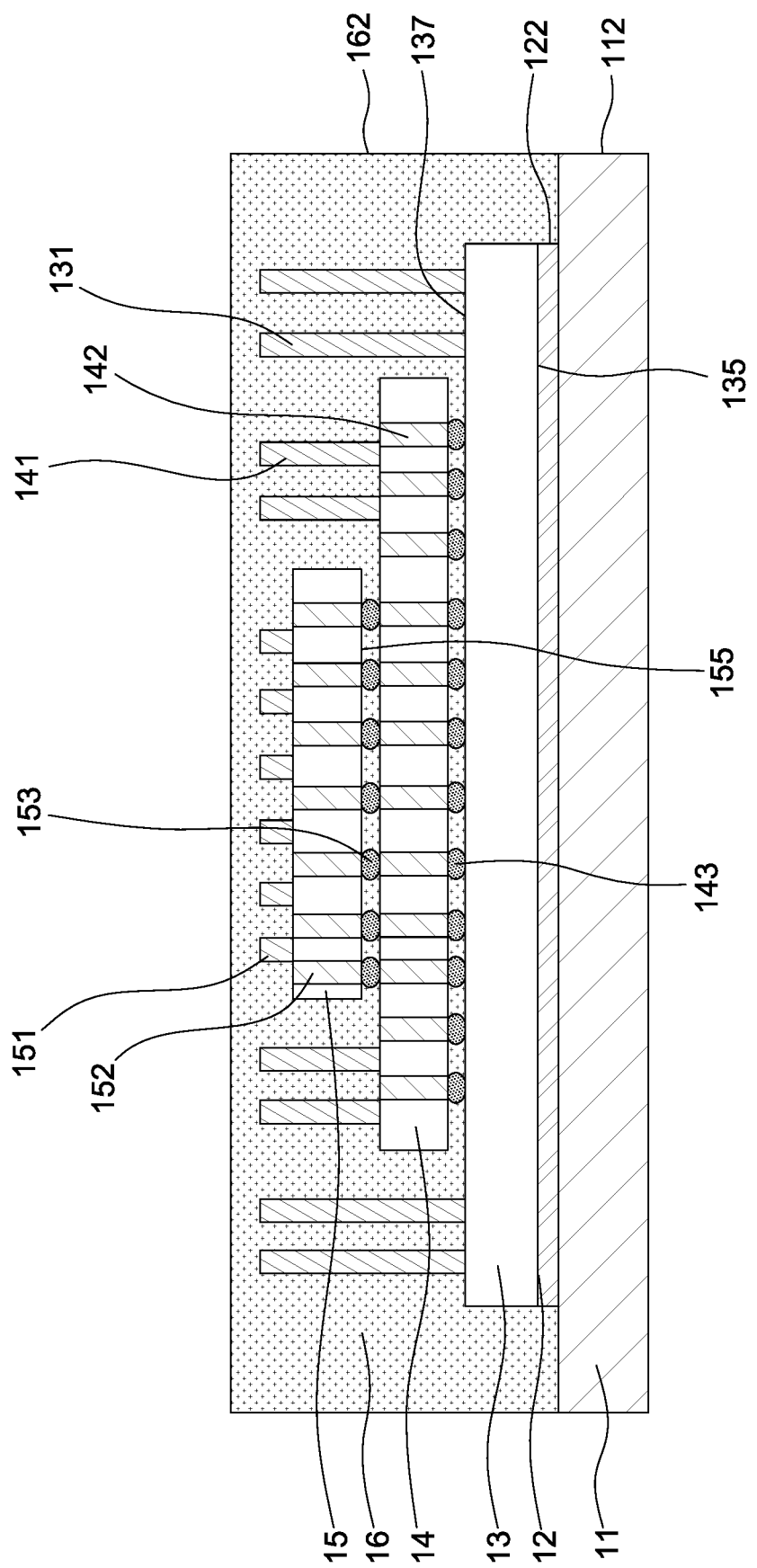

Referring to FIG. 3C, the encapsulant 16 is formed on the heat spreading component 11 to encapsulate the adhesive component 12, the first electronic component 13, the second electronic component 14, the third electronic component 15, and the conductive pillars 131, 141, and 151.

Figure 3D:
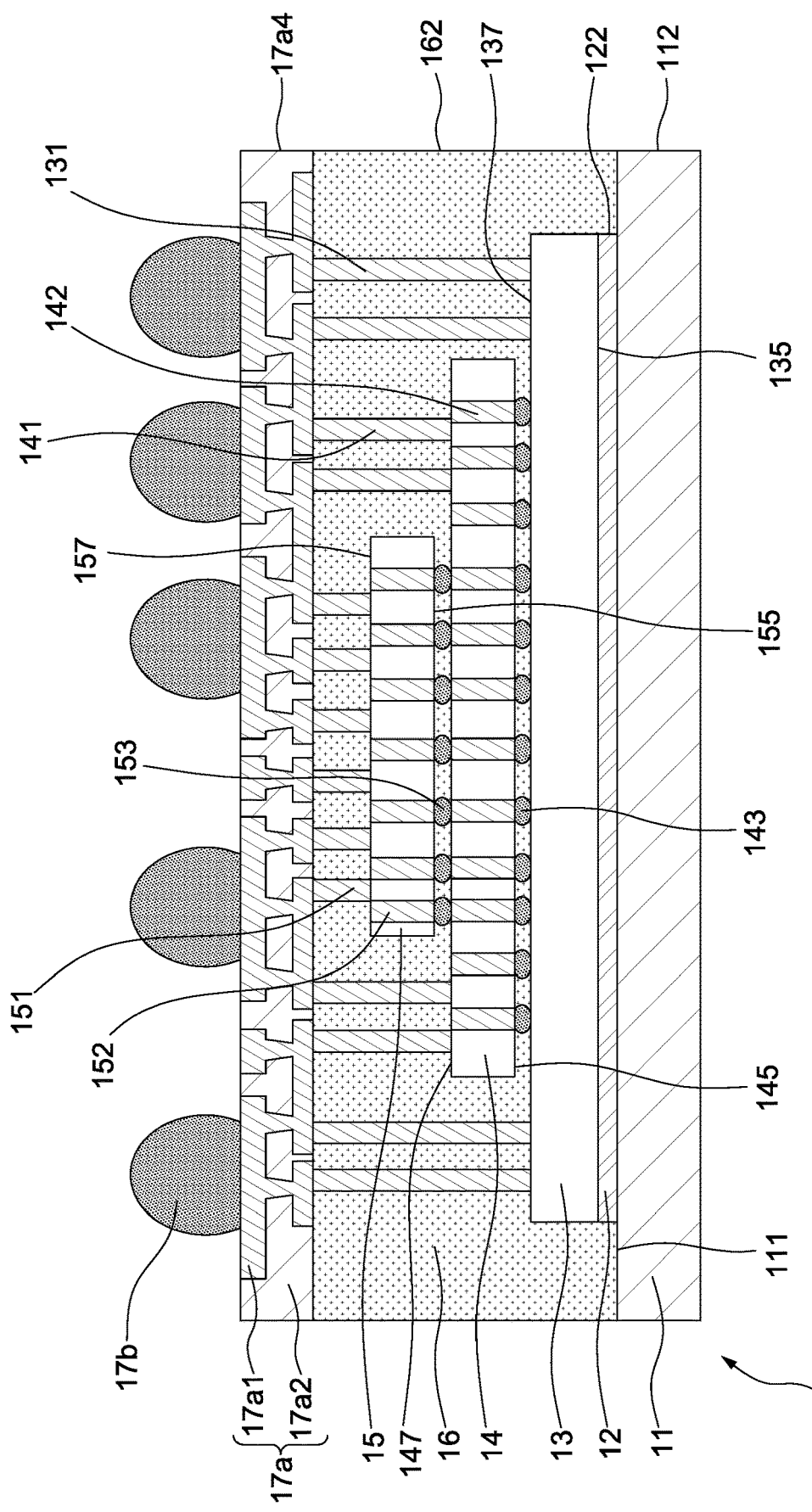

In FIG. 3D, an outer portion of the encapsulant 16 is removed, through for example a grinding process, so as to expose the end portions conductive pillars 131, 141, and 151 on the outer surface of the encapsulant 16. The redistribution structure 17a is disposed on the outer surface of the encapsulant 16 so that it is electrically connected to the end portions of the conductive pillars 131, 141, and 151. The electrical connection 17b is disposed on and electrically connected to the redistribution structure 17a. A singulation operation may be performed on the heat spreading component 11 and the encapsulant 16 so that a lateral surface of the heat spreading component 11 is substantially coplanar with a lateral surface of the encapsulant 16. That is, the lateral surface of the heat spreading component 11 is substantially aligned with the lateral surface of the encapsulant 16.

According to some embodiments, the connections between the elements mentioned above can be made through any manners known and used in the field of semiconductor manufacturing process. For example, according to some embodiments, the conductive pillars 131, 141, and 151 can be connected to the redistribution structure 17a and connected to the first electronic component 13, the second electronic component 14, and the third electronic component 15, respectively, through any manners known and used in the field of the semiconductor manufacturing process. For simplicity, FIGS. 3A to 3D do not show the details of the connecting portions of the conductive pillars 131, 141, and 151.

FIGS. 4A-4D each illustrates a schematic cross-sectional view of a structure at various fabrication stages using a method for manufacturing an electronic package 2 according to some embodiments of the present disclosure.

Figure 4A:
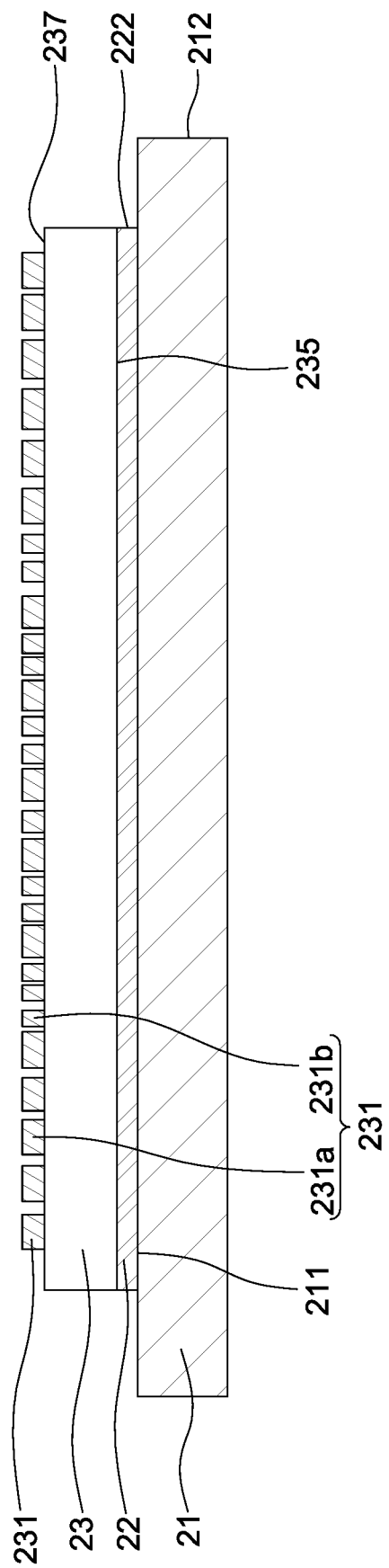
FIG. 4A, FIG. 4B, FIG. 4C and FIG. 4D each illustrates a schematic cross-sectional view of a structure at various fabrication stages using a method for manufacturing an electronic package according to some embodiments of the present disclosure.

Referring to FIG. 4A, a heat spreading component 21 is provided, an adhesive component 22 is applied on the heat spreading component 21, and the first electronic component 23 is attached to the heat spreading component 21 through the adhesive component 22 with its non-active side facing the heat spreading component 21, and the electric connections 231 are formed on the surface 237 of the first electronic component 23. In some embodiments, the surface 237 is the active surface of the first electronic component 23. According to some embodiments of the disclosure, the adhesive component 22 may be a thermal conductive adhesive in a tape form, which has a substantive uniform thickness so that it can seamlessly connects the heat spreading component 21 and the first electronic component 23 together. Furthermore, using the thermal conductive adhesive in a tape form to attach the electronic component to the heat spreading component simplifies the manufacturing process and thus increases the production rate (or units per hour, UPH) of the electronic package.

Figure 4B:
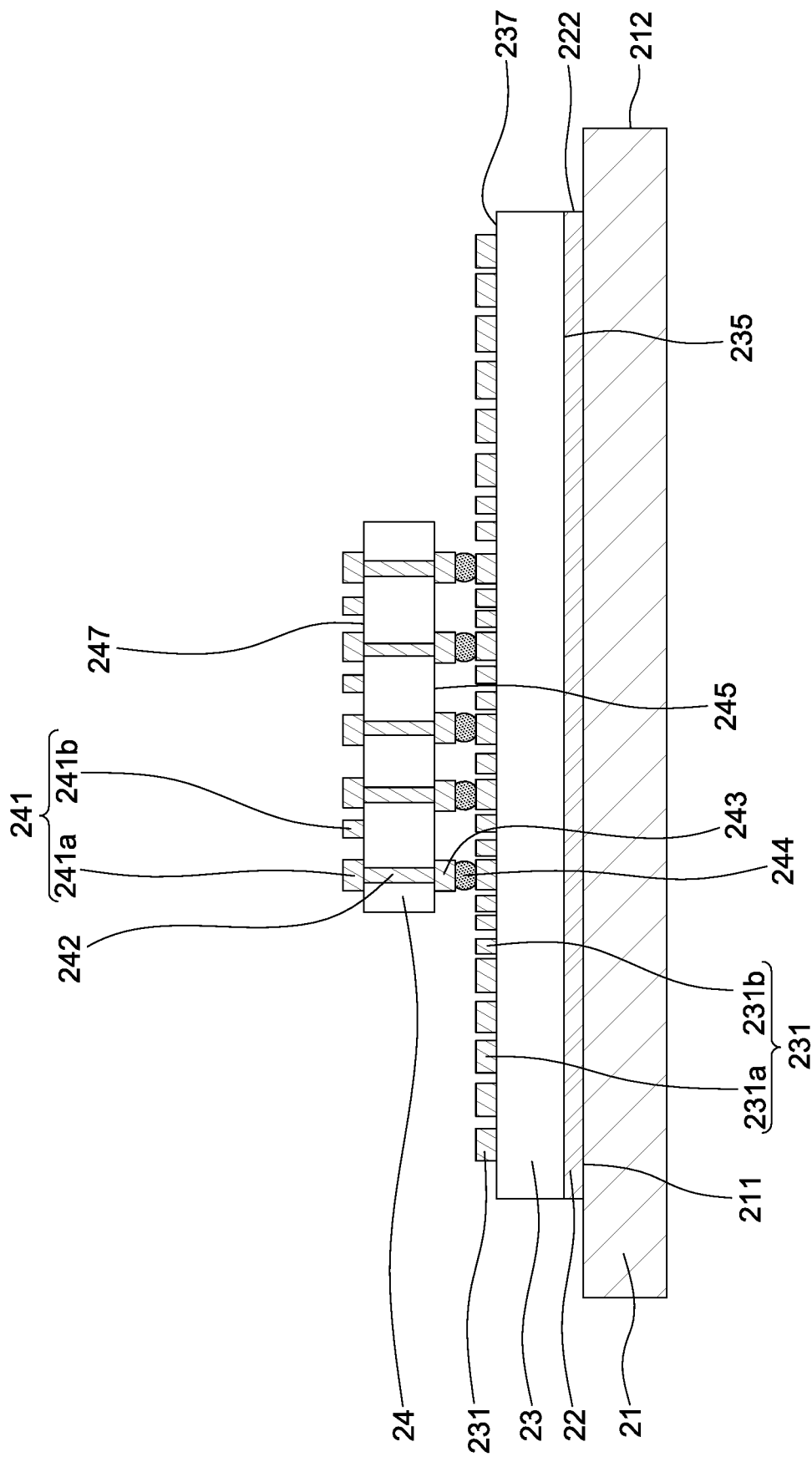

Referring to FIG. 4B, the second electronic component 24 is provided. The second electronic component 24 includes a plurality of electric connections 241 formed on the surface 247, a plurality of electric connections 243 formed on the surface 245, and an interconnection structure 242 passing therethrough and connected between the electric connections 241 and 243. In some embodiments, the surface 245 is the non-active surface of the second electronic component 24. The second electronic component 24 is disposed on the first electronic component 23 through the micro bumps 244.

Figure 4C:
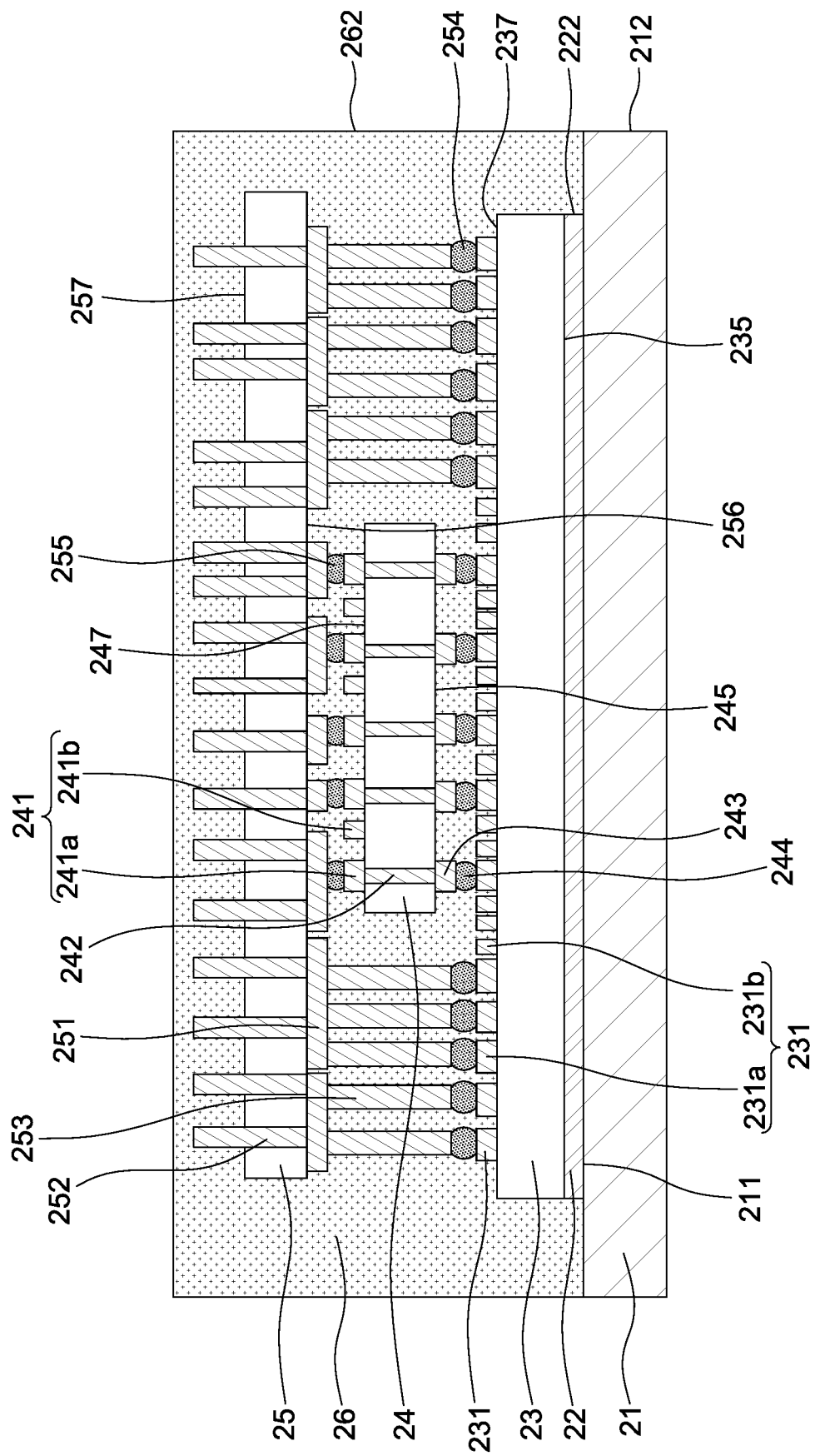

Referring to FIG. 4C, the interposer 25 and the encapsulant 26 are provided. The interposer includes the wiring 251 on the surface 256 facing the first electronic component 23 and the second electronic component 24, the interconnection structure 252 passing through the interposer 25 with one end connecting to the wiring 251 and another end protruding from the surface 257 of the interposer 25. Further, the conductive pillars 253 connect to the wiring 251. The interposer 25 is disposed over the first electronic component 23 through the conductive pillars 253. The interposer 25 is disposed over the second electronic component 24 through the micro bumps 254. The encapsulant 26 is formed on the heat spreading component 21 to encapsulate the adhesive component 22, the first electronic component 23, the second electronic component 24, the interposer 25, and the conductive pillars 253 after the interposer 25 is stacked.

Figure 4D:
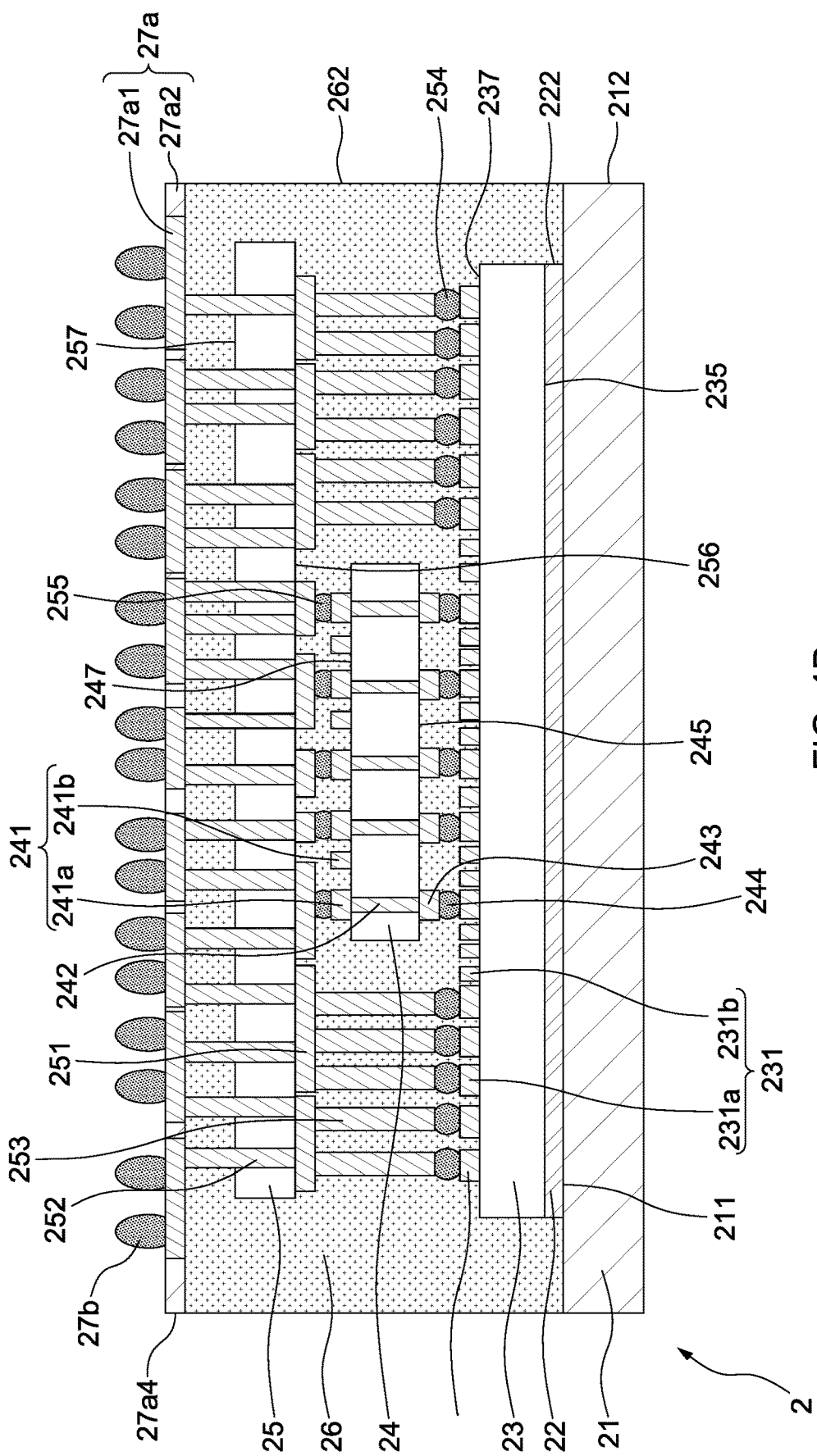

Referring to FIG. 4D, an outer portion of the encapsulant 26 is removed, through for example a grinding process, so that the end portions of the interconnection structure 252 are exposed on the outer surface of the encapsulant 26. Then, the redistribution structure 27a is formed on the outer surface of the encapsulant 26 and is electrically connected to end portions of the interconnection structure 252. Further, the electrical connections 27b are disposed on and electrically connected to the redistribution structure 27a. A singulation operation may be performed on the heat spreading component 21 and the encapsulant 26 so that a lateral surface of the heat spreading component 21 is substantially coplanar with a lateral surface of the encapsulant 26. That is, the lateral surface of the heat spreading component 21 is substantially aligned with a lateral surface of the encapsulant 26.

According to some embodiments, the connections between the elements mentioned above can be made through any manners known and used in the field of semiconductor manufacturing process. For example, according to some embodiments, the conductive pillars 253 be connected to the wiring 251 and the interconnection structure 252 can be connected to the redistribution structure 27a through any manners known and used in the field of the semiconductor manufacturing process. For simplicity, FIGS. 4A to 4D do not show the details of the connecting portions of the conductive pillars 253 and the interconnection structure 252.

As described above, in the manufacturing process according to some embodiments of the present disclosure, the stack of the first and second electronic components are disposed on the heat spreading component, rather than being disposed on a carrier first. Thus, there is no need to perform a de-carrier process prior to attaching the stack of electronic components to a heat spreading component or a high thermal conductive film. Therefore, the manufacturing process of the package structure can be simplified and can be more cost-effective. In addition, instead of using a thermal interface material (TIM), according to some embodiments, the present disclosure uses the thermal conductive adhesive in a tape form, which avoids the delamination issue between the TIM and the electronic component during the during the de-carrier process and avoids the residue of the TIM on the surface of the electronic component after the de-carrier process. Furthermore, since the first and second electronic components are disposed on the heat spreading component and then the encapsulant is formed on the heat spreading component so as to encapsulant the stack of the electronic components, the stack of the electronic components can be protected by the encapsulant. According to some embodiments of the present disclosure, the lateral surface of the encapsulant is substantially coplanar with the lateral surface of the heat spreading component. That is, the lateral surface of the encapsulant is substantially aligned with the lateral surface of the heat spreading component. Moreover, the manufacturing processes of the electronic packages according to the present disclosure allow the addition of the redistribution layer to the electronic packages for the stacked electronic components such as 2.5D or 3D IC packages.

Figure 5A:
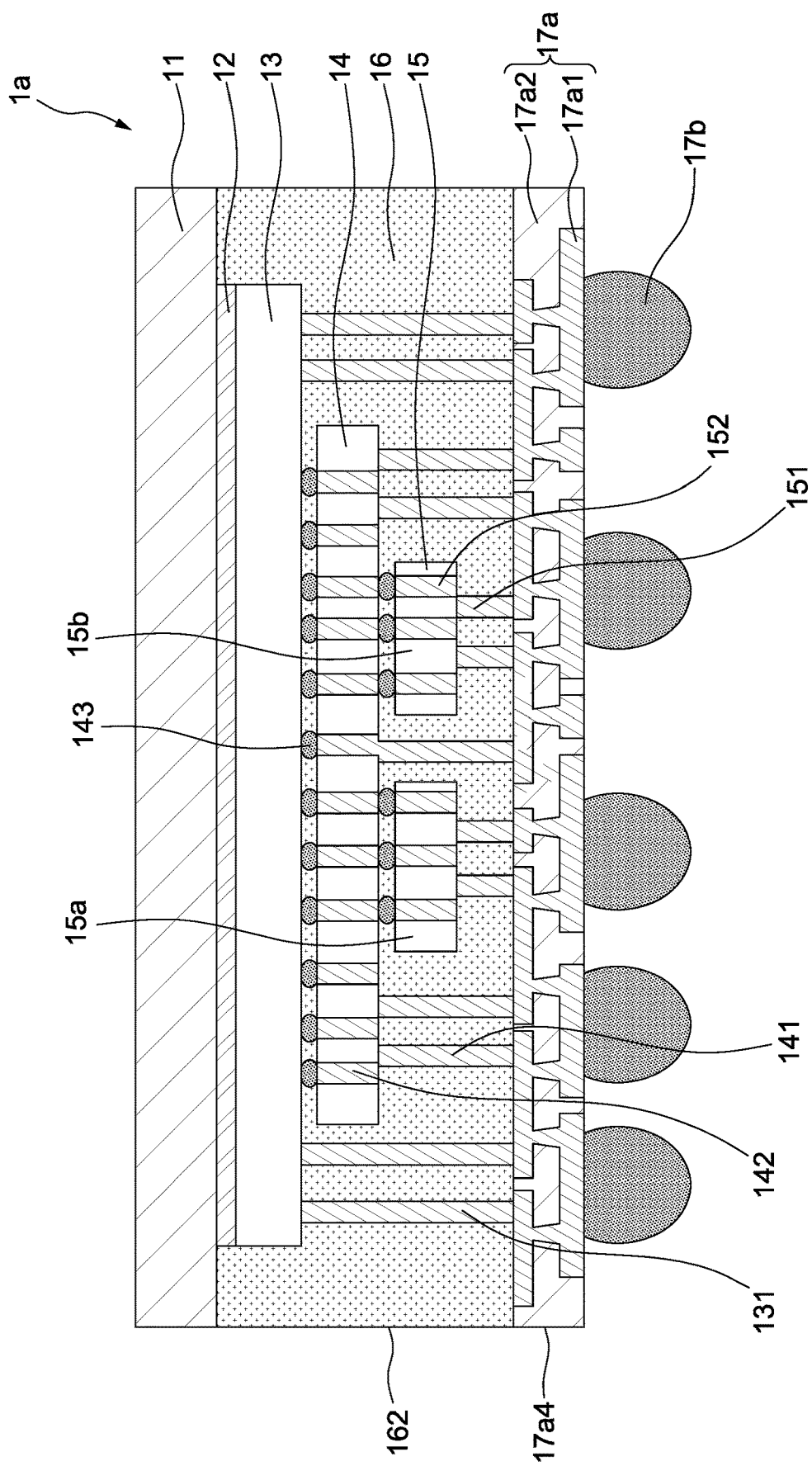
FIG. 5A illustrates a schematic cross-sectional view of an electronic package according to some embodiments of the present disclosure.
Figure 5B:
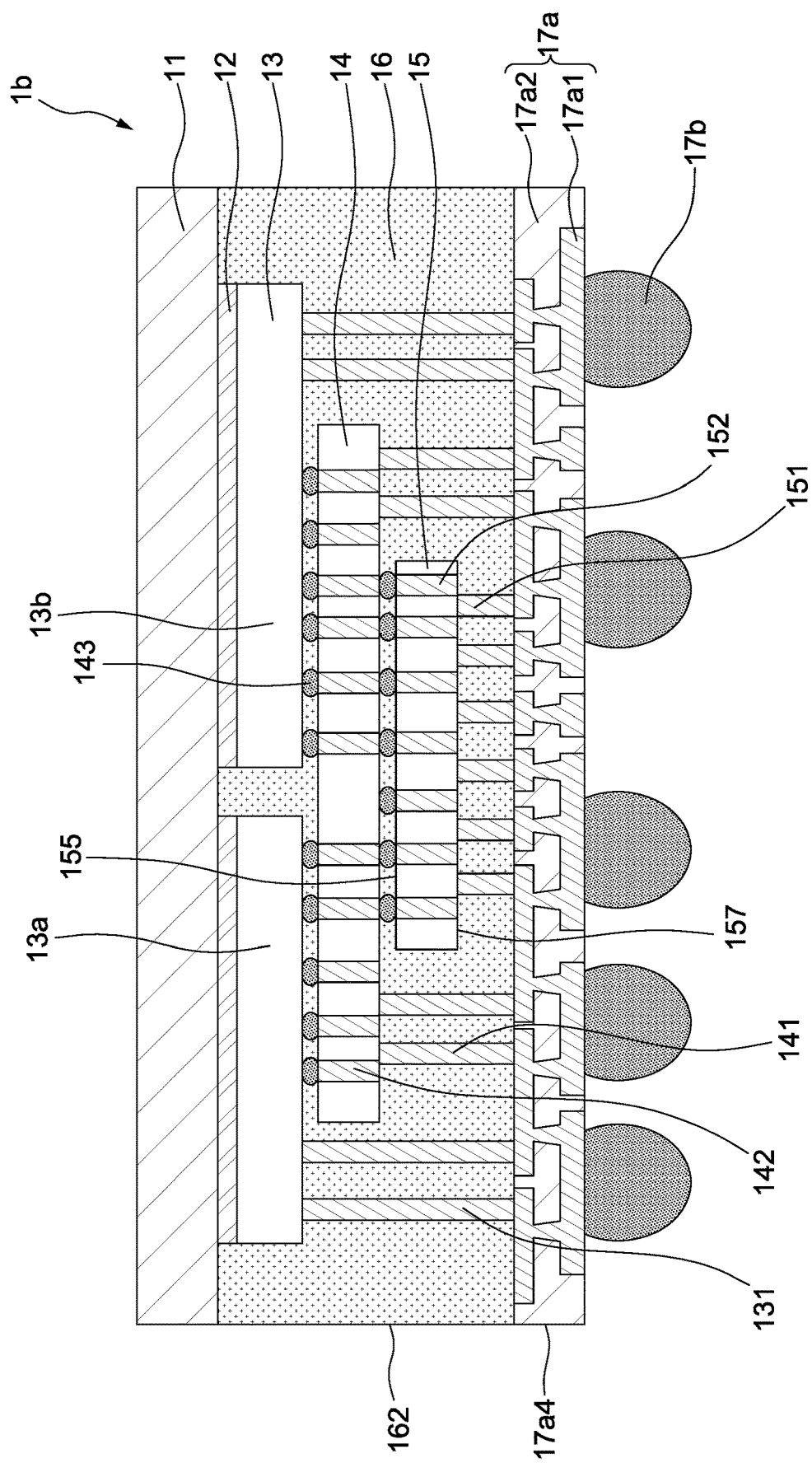
FIG. 5B illustrates a schematic cross-sectional view of an electronic package according to some embodiments of the present disclosure.
Figure 5C:
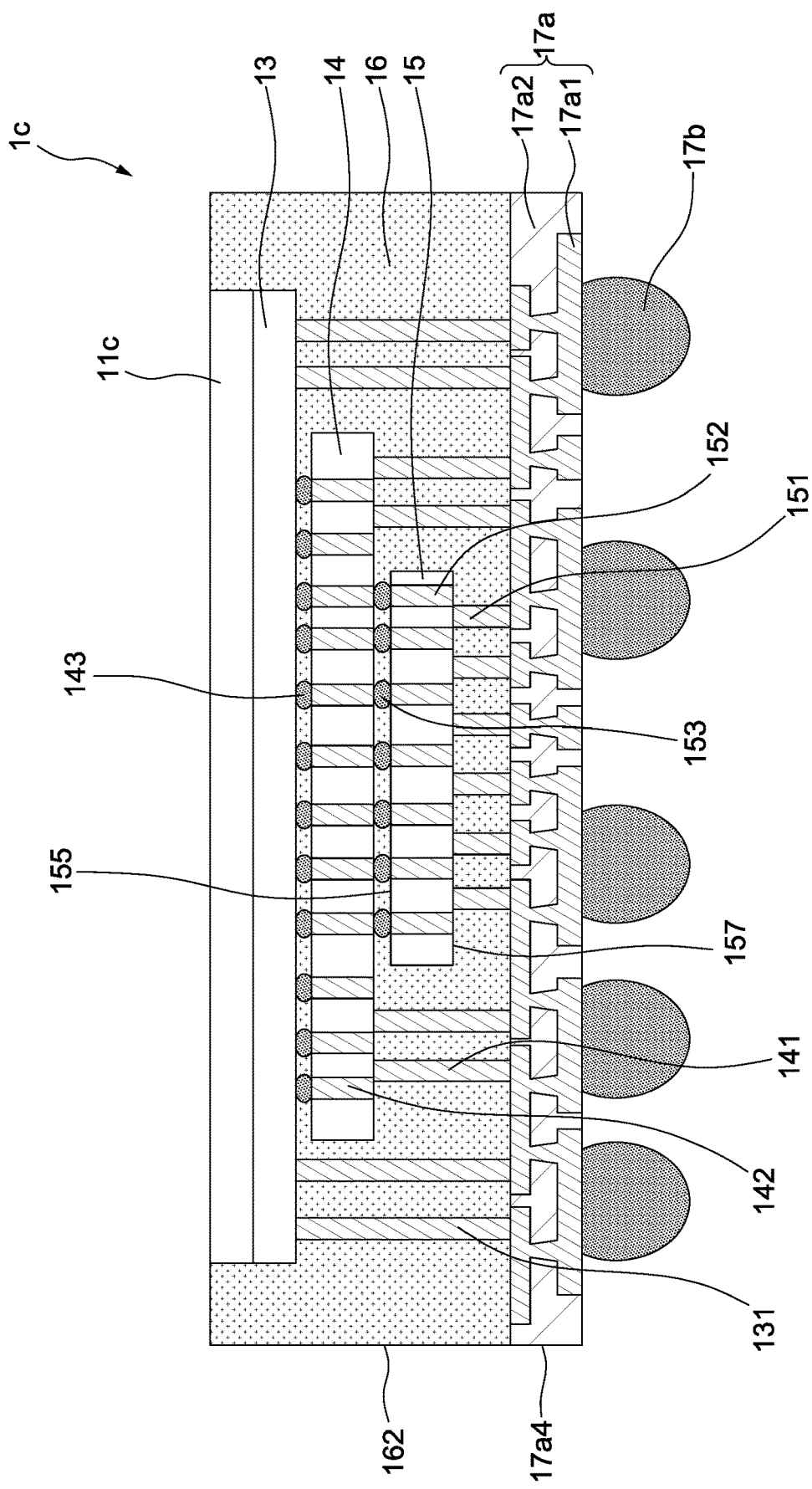
FIG. 5C illustrates a schematic cross-sectional view of an electronic package according to some embodiments of the present disclosure.

FIGS. 5A-5C illustrate cross-sectional views of various electronic packages according to some embodiments of the present disclosure.

Referring to FIG. 5A, FIG. 5A illustrates a cross-sectional view of an electronic package 1a according to some embodiments of the present disclosure. The electronic package 1a may be substantially similar to the electronic package 1 of FIG. 1 except for the electronic package 1a includes two of the third electronic components 15a and 15b. According to some embodiments of the present disclosure, the electronic package 1a may include three or more of the second electronic components.

Referring to FIG. 5B, FIG. 5B illustrates a cross-sectional view of an electronic package 1b according to some embodiments of the present disclosure. The electronic package 1b may be substantially similar to the electronic package 1 of FIG. 1 except for the electronic package 1b includes two of the first electronic components 13a and 13b. According to some embodiments of the present disclosure, the electronic package 1b may include three or more of the first electronic components. Moreover, a sum of a cross-sectional width of the first electronic component 13a and a cross-sectional width of the first electronic component 13b may be greater than a cross-sectional width of the second electronic component 14.

Referring to FIG. 5C, FIG. 5C illustrates a cross-sectional view of an electronic package 1c according to some embodiments of the present disclosure. The electronic package 1c may be substantially similar to the electronic package 1 of FIG. 1 except for the heat spreading component 11 is replaced with a high thermal conductive film 11c and there is no adhesive component between the high thermal conductive film 11c and the first electronic component 13. According to some embodiments of the present disclosure, the lateral surfaces of the high thermal conductive film 11c are encapsulated by the encapsulant 16.

Figure 6A:
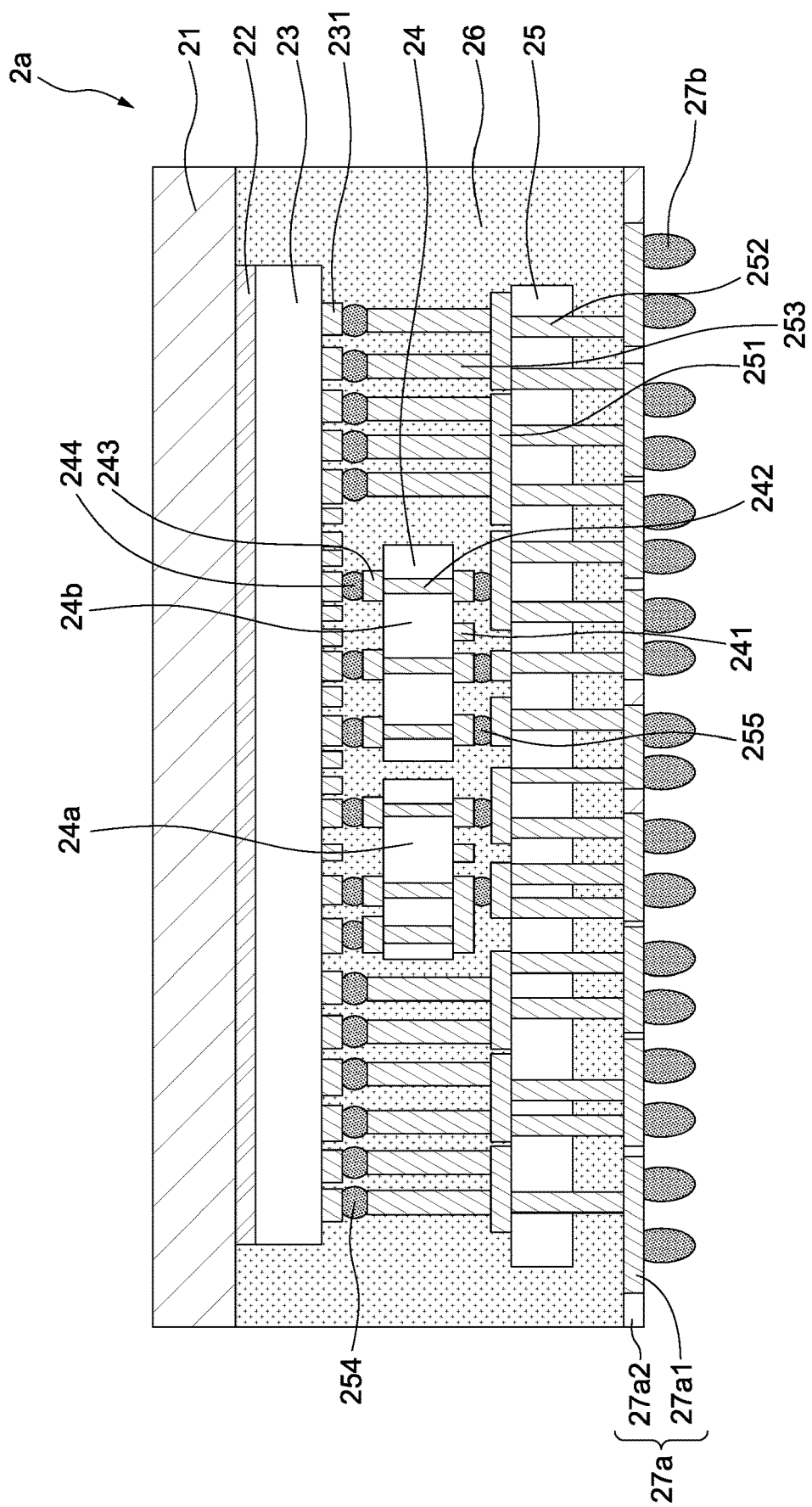
FIG. 6A illustrates a schematic cross-sectional view of an electronic package according to some embodiments of the present disclosure.
Figure 6B:
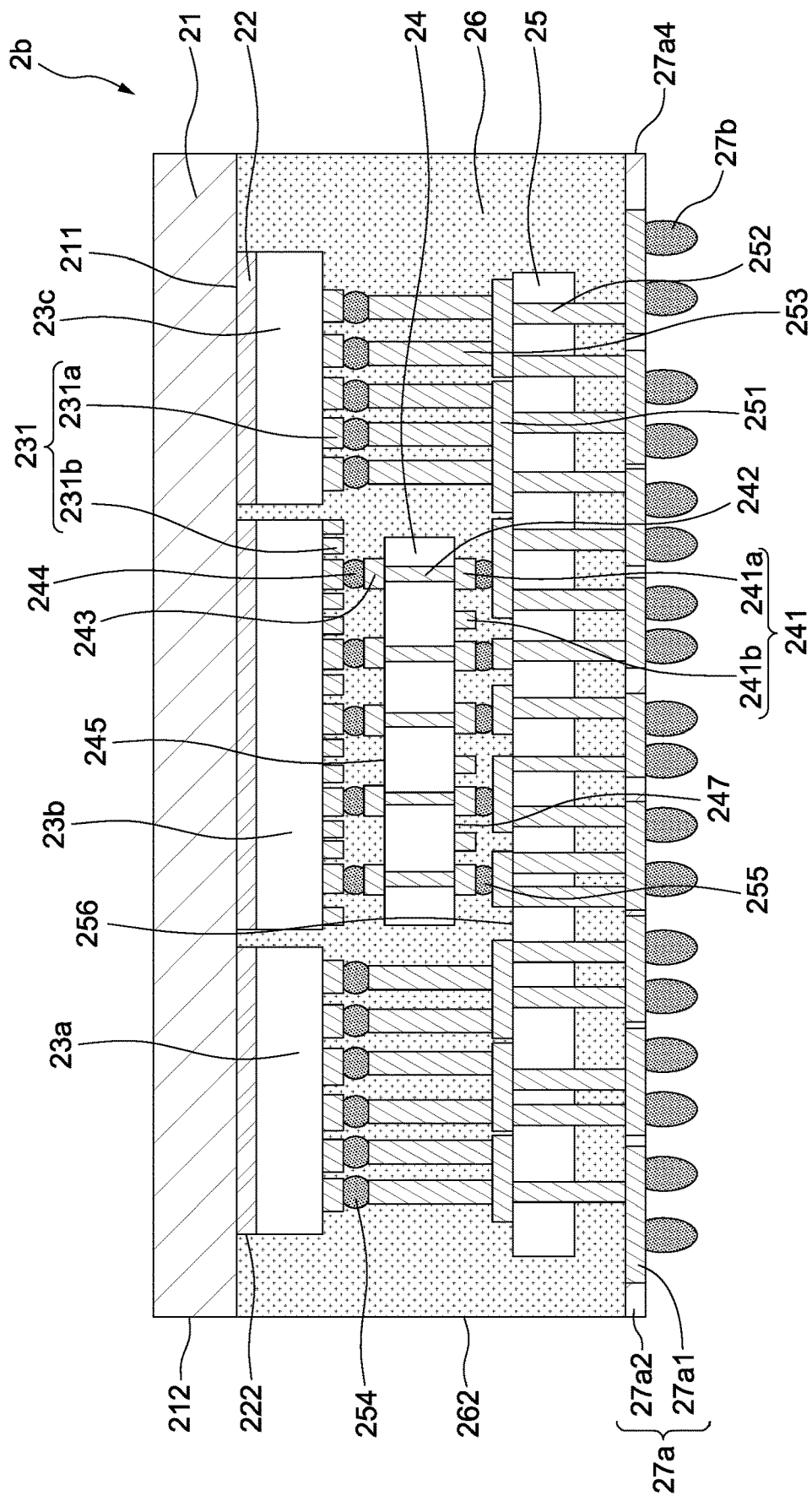
FIG. 6B illustrates a schematic cross-sectional view of an electronic package according to some embodiments of the present disclosure.
Figure 6C:
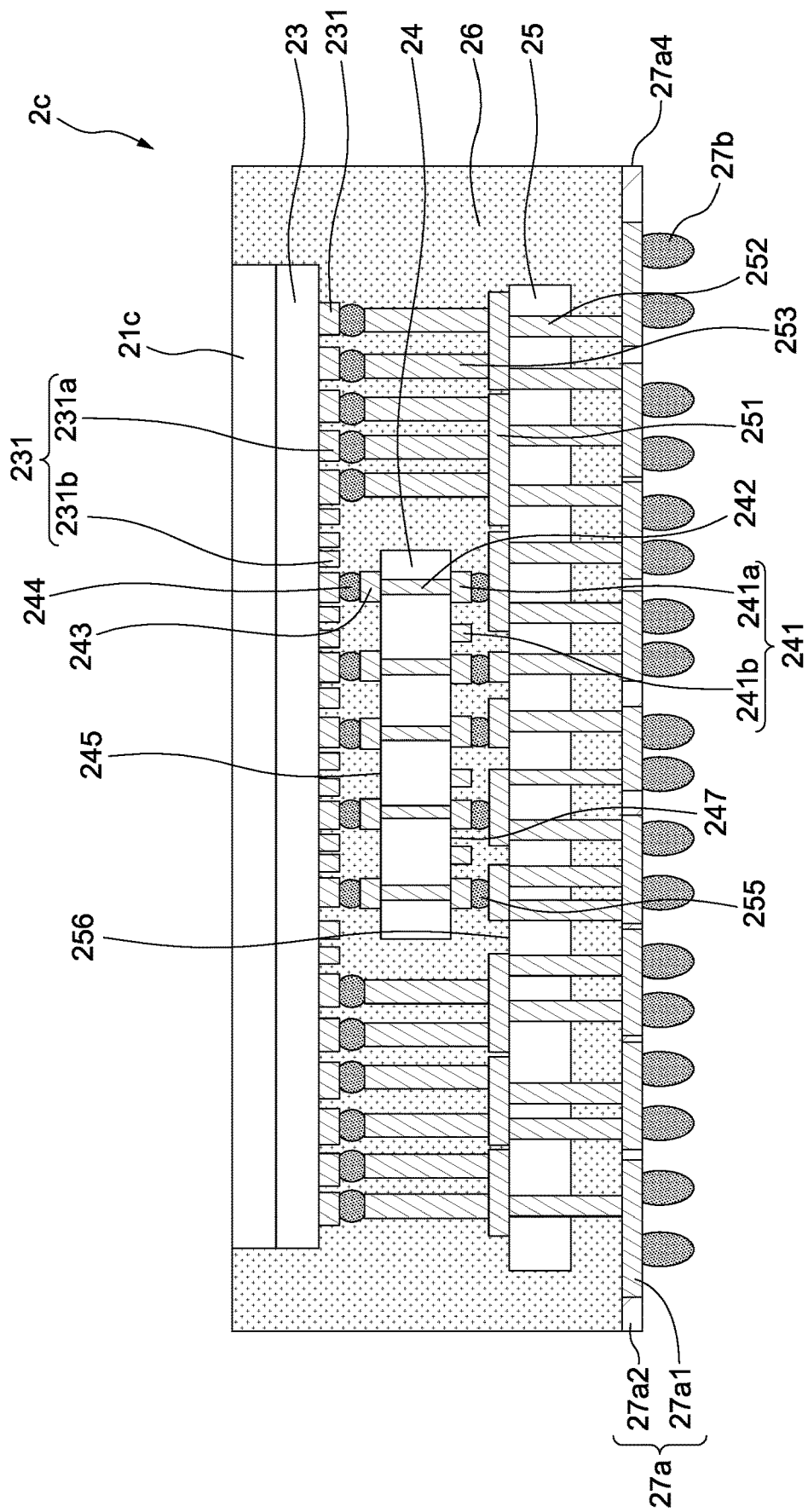
FIG. 6C illustrates a schematic cross-sectional view of an electronic package according to some embodiments of the present disclosure.

FIGS. 6A-6C illustrate cross-sectional views of various electronic packages according to some embodiments of the present disclosure.

Referring to FIG. 6A, FIG. 6A illustrates a cross-sectional view of an electronic package 2a according to some embodiments of the present disclosure. The electronic package 2a may be substantially similar to the electronic package 2 of FIG. 2 except for the electronic package 6a includes two of the second electronic components 24a and 24b. According to some embodiments of the present disclosure, the electronic package 2a may include three or more of the second electronic components.

Referring to FIG. 6B, FIG. 6B illustrates a cross-sectional view of an electronic package 2b according to some embodiments of the present disclosure. The electronic package 2b may be substantially similar to the electronic package 2 of FIG. 2 except for the electronic package 2b includes three of the first electronic components 23a, 23b, and 23c. According to some embodiments of the present disclosure, the electronic package 2b may include two of the first electronic components or four or more of the first electronic components. Moreover, a sum of a cross-sectional width of the first electronic component 23a, a cross-sectional width of the first electronic component 23b and a cross-sectional width of the first electronic component 23c may be greater than a cross-sectional width of the second electronic component 24.

Referring to FIG. 6C, FIG. 6C illustrates a cross-sectional view of an electronic package 2c according to some embodiments of the present disclosure. The electronic package 2c may be substantially similar to the electronic package 2 of FIG. 2 except for the heat spreading component 21 is replaced with a high thermal conductive film 21c and there is no adhesive component 22 between the high thermal conductive film 21c and the first electronic component 23. According to some embodiments of the present disclosure, the lateral sides of the high thermal conductive film 21c are encapsulated by the encapsulant 26.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for the purpose of illustration only, and that practical implementations of the structures described herein can be spatially arranged in any orientation or manner, provided that the merits of the embodiments of this disclosure are not deviated from by such an arrangement.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
a heat spreading component;
a first electronic component disposed under the heat spreading component;
a second electronic component disposed under the heat spreading component, and
an encapsulant disposed under the heat spreading component and encapsulating the first electronic component and the second electronic component,
wherein, in a cross-sectional view, a width of the first electronic component is greater than a width of the second electronic component, and the first electronic component is closer to the heat spreading component than the second electronic component is;
wherein a first pillar is disposed on a bottom surface of the first electronic component, the bottom surface of the first electronic component facing away from the heat spreading component, wherein the first pillar is encapsulated by the encapsulant and is exposed at a bottom surface of the encapsulant, the bottom surface of the encapsulant facing away from the heat spreading component;
wherein a first bump is disposed on the bottom surface of the first electronic component, and wherein the first bump is connected to the second electronic component;
wherein the first pillar and the first bump are overlapped with each other in a direction substantially parallel to a bottom surface of the heat spreading component, the bottom surface of the heat spreading component facing the encapsulant.

2. The electronic package of claim 1, further comprising:
a third electronic component disposed under the heat spreading component and encapsulated by the encapsulant, wherein, in the cross-sectional view, the width of the second electronic component is greater than a width of the third electronic component, and the second electronic component is closer to the heat spreading component than the third electronic component is;
a second pillar is disposed on a bottom surface of the second electronic component, the bottom surface of the second electronic component facing away from the first electronic component, wherein the second pillar is encapsulated by the encapsulant and is exposed at the bottom surface of the encapsulant;
a second bump is disposed on the bottom surface of the second electronic component, and wherein the second bump is connected to the third electronic component;
wherein the second pillar and the second bump are overlapped with each other in the direction substantially parallel to the bottom surface of the heat spreading component.

3. The electronic package of claim 2, further comprising a third pillar disposed on the bottom surface of the first electronic component, wherein the third pillar is encapsulated by the encapsulant and is exposed at the bottom surface of the encapsulant, and wherein the second pillar and the third pillar are positioned adjacent to each other, and wherein, in the cross-sectional view, a distance between the second pillar and the third pillar is greater than a pitch of the first pillar and the third pillar in the direction substantially parallel to the bottom surface of the heat spreading component.

4. The electronic package of claim 3, wherein the second electronic component comprises an interconnection that passes through the second electronic component, and wherein the first pillar overlaps the interconnection of the second electronic component in the direction substantially parallel to the bottom surface of the heat spreading component.

5. The electronic package of claim 1, further comprising a redistribution structure connected to the first pillar, wherein the redistribution structure comprises a via tapered toward the first pillar.

6. The electronic package of claim 5, further comprising:
- a third pillar disposed on the bottom surface of the first electronic component and configured to transmit heat from the first electronic component to the redistribution structure, wherein the third pillar is encapsulated by the encapsulant and is exposed at the bottom surface of the encapsulant;
- a second pillar disposed on a bottom surface of the second electronic component, the bottom surface of the second electronic component facing away from the first electronic component, and the second pillar is configured to transmit heat from the second electronic component to the redistribution structure, and wherein the second pillar is encapsulated by the encapsulant and is exposed at the bottom surface of the encapsulant;
- a fourth pillar disposed on the bottom surface of the second electronic component and configured to transmit heat from the second electronic component to the redistribution structure, wherein the fourth pillar is encapsulated by the encapsulant and is exposed at the bottom surface of the encapsulant;
- a first solder under the redistribution structure, wherein the first solder overlaps the first pillar and the third pillar in a direction substantially perpendicular to the bottom surface of the heat spreading component;
- a second solder under the redistribution structure, wherein the second solder overlaps the second pillar and the fourth pillar in the direction substantially perpendicular to the bottom surface of the heat spreading component.

7. The electronic package of claim 6, further comprising a fifth pillar disposed on a bottom surface of the third electronic component, the bottom surface of the third electronic component facing away from the second electronic component, and the fifth pillar is configured to transmit heat from the third electronic component to the redistribution structure, and wherein the fifth pillar is encapsulated by the encapsulant and is exposed at the bottom surface of the encapsulant; wherein the redistribution structure comprises a first trace and a second trace exposed at a top surface of the redistribution structure, the top surface of the redistribution structure facing the heat spreading component, wherein the third pillar and the second pillar are in contact with the first trace, and wherein the fourth pillar and the fifth pillar are in contact with the second trace.

8. The electronic package of claim 4, wherein the third electronic component comprises an interconnection that passes through the third electronic component, and wherein the second pillar overlaps the interconnection of the third electronic component in the direction substantially parallel to the bottom surface of the heat spreading component.

9. The electronic package of claim 8, wherein the interconnection of the second electronic component is configured to transmit heat from the second electronic component toward the heat spreading component, and the interconnection of the third electronic component is configured to transmit heat from the third electronic component toward the heat spreading component.

10. The electronic package of claim 9, further comprising a redistribution structure, which is connected to the first electronic component through the first pillar and connected to the second electronic component through the second pillar and connected to the third electronic component through an fifth pillar, wherein the fifth pillar is disposed on a bottom surface of the third electronic component, the bottom surface of the third electronic component facing away from the second electronic component, and wherein the fifth pillar is encapsulated by the encapsulant and is exposed at the bottom surface of the encapsulant, and wherein the first pillar is configured to transmit heat from the first electronic component to the redistribution structure, wherein the second pillar is configured to transmit heat from the second electronic component to the redistribution structure, and wherein the fifth pillar is configured to transmit heat from the third electronic component to the redistribution structure.

11. An electronic package, comprising:
- a heat spreading component;
- a first electronic component disposed under the heat spreading component;
- a second electronic component disposed under the first electronic component, and
- a third electronic component disposed under the second electronic component,
- wherein, in a cross-sectional view, a width of the first electronic component is greater than a width of the second electronic component, and a width of the third electronic component is greater than the width of the second electronic component;
- wherein a plurality of pillars is disposed between the first electronic component and the third electronic component and spaced apart from the second electronic component;
- wherein the second electronic component comprises a plurality of first interconnections passing through the second electronic components;
- wherein a pitch of the pillars is less than a pitch of the first interconnections.

12. The electronic package of claim 11, wherein, in the cross-sectional view, the first electronic component has a left side surface and a right side surface opposite to the left side surface, and the third component has a left side surface and a right side surface opposite to the left side, and wherein the left side surface of the third electronic component protrudes relative to the left side surface of the first electronic component, and the right side of the third electronic component recesses relative to the right side of the first electronic component in a direction substantially parallel to a bottom surface of the heat spreading component, the bottom surface of the heat spreading component facing the first electronic component.

13. The electronic package of claim 11, further comprising an encapsulant encapsulating the first electronic component, the second electronic component and the third electronic component, wherein the encapsulate extends under the third electronic component.

14. The electronic package of claim 13, wherein the third electronic component comprises a plurality of second interconnections passing through the third electronic component and protruding from the surface of the third electronic component, and wherein the plurality of second interconnections is exposed at a bottom surface of the encapsulant, the bottom surface of the encapsulant facing away from the heat spreading component.

15. The electronic package of claim 14, wherein one of the plurality of second interconnections is thermally connected to the first electronic component, and another one of the plurality of second heat conductive interconnections is thermally connected to the second electronic component.

16. The electronic package of claim 11, wherein the plurality of first interconnections is configured to transmit heat from the second electronic component toward the heat spreading element and toward the third electronic component.

\* \* \* \* \*